(12) United States Patent
Jeon et al.

(10) Patent No.: US 10,892,142 B2
(45) Date of Patent: Jan. 12, 2021

(54) SYSTEM FOR FABRICATING A SEMICONDUCTOR DEVICE

(71) Applicant: Samsung Electronics Co., Ltd., Suwon-si (KR)

(72) Inventors: Sangjean Jeon, Suwon-si (KR); Jinyoung Park, Anyang-si (KR); Chanhoon Park, Osan-si (KR); Hoyong Park, Hwaseong-si (KR); Jin Young Bang, Hwaseong-si (KR); JungHwan Um, Seongnam-si (KR); Il Sup Choi, Yongin-si (KR); Je-Woo Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 100 days.

(21) Appl. No.: 16/182,737

(22) Filed: Nov. 7, 2018

(65) Prior Publication Data

US 2019/0287766 A1 Sep. 19, 2019

(30) Foreign Application Priority Data

Mar. 16, 2018 (KR) .......................... 10-2018-0030875
Mar. 30, 2018 (KR) .......................... 10-2018-0037434

(51) Int. Cl.
*H01J 37/32* (2006.01)
*H01L 21/683* (2006.01)

(52) U.S. Cl.
CPC .. *H01J 37/32183* (2013.01); *H01J 37/32697* (2013.01); *H01J 37/32715* (2013.01);
(Continued)

(58) Field of Classification Search
CPC ........... H01J 37/32183; H01J 37/32697; H01J 37/32715; H01J 2237/332;
(Continued)

(56) References Cited

U.S. PATENT DOCUMENTS 7,527,016 B2 3/2009 Yamazawa et al.
7,683,289 B2 3/2010 Dhindsa et al.
(Continued)

FOREIGN PATENT DOCUMENTS

KR 10-0903535 B1 6/2009

*Primary Examiner* — Ram N Kackar
(74) *Attorney, Agent, or Firm* — Muir Patent Law, PLLC

(57) ABSTRACT

A system for fabricating a semiconductor device may include a chamber, an electrostatic chuck used to load a substrate, a power source supplying an RF power to the electrostatic chuck, an impedance matcher between the power source and the electrostatic chuck, and a power transmission unit connecting the electrostatic chuck to the impedance matcher. The power transmission unit may include a power rod, which is connected to the electrostatic chuck and has a first outer diameter, and a coaxial cable. The coaxial cable may include an inner wire, an outer wire, and a dielectric material between the outer and inner wires. The inner wire connects the power rod to the impedance matcher and has a second outer diameter less than the first outer diameter. The outer wire is connected to the chamber and is provided to enclose the inner wire and has a first inner diameter less than the first outer diameter and greater than the second outer diameter. A ratio of the first inner diameter to the second outer diameter is greater than a dielectric constant of the dielectric material and less than three times the dielectric constant of the dielectric material.

6 Claims, 12 Drawing Sheets

(52) U.S. Cl.
CPC .... *H01L 21/6833* (2013.01); *H01J 37/32091* (2013.01); *H01J 2237/332* (2013.01); *H01J 2237/3343* (2013.01)

(58) Field of Classification Search
CPC ......... H01J 37/32091; H01J 2237/3343; H01J 37/32082; H01L 21/6833
See application file for complete search history.

(56) References Cited

U.S. PATENT DOCUMENTS

| | | |
|---|---|---|
| 8,562,798 B2 | 10/2013 | Brown et al. |
| 9,218,943 B2 | 12/2015 | Yamazawa |
| 2002/0108933 A1 | 8/2002 | Hoffman et al. |
| 2006/0066331 A1* | 3/2006 | Yoshida ............. G01R 1/07314 324/756.03 |
| 2015/0243483 A1 | 8/2015 | Chen et al. |
| 2016/0307743 A1 | 10/2016 | Brown et al. |
| 2016/0372307 A1 | 12/2016 | Yang et al. |
| 2017/0069464 A1 | 3/2017 | Ye et al. |

\* cited by examiner

FIG. 12

| Dielectric Constant(εr) | Air 1.0 | Teflon 2.1 | Ultem 3.0 | PEEK 3.2 | Quartz 3.9 | Alumina 9.0 |
|---|---|---|---|---|---|---|
| Z0 | b/a | b/a | b/a | b/a | b/a | b/a |
| 35.9 | 1.82 | 2.38 | 2.82 | 2.91 | 3.26 | 6.01 |
| 40 | 1.95 | 2.63 | 3.17 | 3.29 | 3.73 | 7.38 |
| 45 | 2.12 | 2.96 | 3.66 | 3.82 | 4.39 | 9.47 |
| 50 | 2.30 | 3.34 | 4.23 | 4.43 | 5.18 | 12.16 |
| 55 | 2.50 | 3.77 | 4.89 | 5.15 | 6.10 | 15.60 |
| 60 | 2.72 | 4.25 | 5.64 | 5.97 | 7.19 | 20.03 |
| 65 | 2.95 | 4.80 | 6.52 | 6.93 | 8.48 | 25.72 |
| 70 | 3.21 | 5.41 | 7.53 | 8.05 | 9.99 | 33.01 |
| 75 | 3.49 | 6.11 | 8.70 | 9.34 | 11.78 | 42.38 |

US 10,892,142 B2

SYSTEM FOR FABRICATING A SEMICONDUCTOR DEVICE

CROSS-REFERENCE TO RELATED APPLICATIONS

This U.S. non-provisional patent application claims priority under 35 U.S.C. § 119 to Korean Patent Application No. 10-2018-0030875 filed on Mar. 16, 2018, and 10-2018-0037434 filed on Mar. 30, 2018, in the Korean Intellectual Property Office, the entire contents of each of which are hereby incorporated by reference.

BACKGROUND OF THE INVENTION

The present disclosure relates to a system, which may be used to fabricate a semiconductor device, and in particular, to a system, which may be used to etch a layer or substrate constituting a semiconductor device.

In general, a semiconductor device may be fabricated by a plurality of unit processes. The unit processes include a deposition process, a lithography process, and an etching process. The deposition process and the etching process may be performed using plasma. The plasma may be used to treat a substrate at a high temperature. Generally, the plasma is generated by a radio frequency (RF) power.

SUMMARY

Some example embodiments of the inventive concept provide a manufacturing system, which is configured to etch a substrate of a semiconductor device in an increased etch uniformity.

According to some example embodiments of the inventive concept, a system for fabricating a semiconductor device may include a chamber, an electrostatic chuck provided in the chamber and used to load a substrate, a power source configured to supply an RF power to the electrostatic chuck, an impedance matcher provided between the power source and the electrostatic chuck to connect the power source to the electrostatic chuck, and a power transmission unit connecting the electrostatic chuck to the impedance matcher. The power transmission unit may include a power rod, which is connected to the electrostatic chuck and has a first outer diameter, and a coaxial cable. The coaxial cable may include an inner wire, an outer wire, and a dielectric material between the outer and inner wires. The inner wire connects the power rod to the impedance matcher and has a second outer diameter less than the first outer diameter. The outer wire is connected to the chamber and is provided to enclose the inner wire and has a first inner diameter less than the first outer diameter and greater than the second outer diameter. A ratio of the first inner diameter to the second outer diameter is greater than a dielectric constant of the dielectric material and less than three times the dielectric constant of the dielectric material.

According to some example embodiments of the inventive concept, a method for fabricating a semiconductor device may include: providing an electrostatic chuck in a chamber; loading a substrate on the electrostatic chuck; providing an impedance matcher between the electrostatic chuck and a power source, the power source being configured to supply an RF power to the electrostatic chuck and the impedance matcher being configured to allow a source impedance of the power source to have an impedance value match with an impedance value of the chamber; and connecting the electrostatic chuck to the impedance matcher via a power transmission unit. The power transmission unit may include: a power rod connected to the electrostatic chuck, the power rod having a first outer diameter; and a coaxial cable including an inner wire, an outer wire, and a dielectric material between the outer and inner wires. The inner wire connects the power rod to the impedance matcher and has a second outer diameter less than the first outer diameter. The outer wire is connected to the chamber and is provided to enclose the inner wire and having a first inner diameter less than the first outer diameter and greater than the second outer diameter. A ratio of the first inner diameter to the second outer diameter is greater than a dielectric constant of the dielectric material and less than three times the dielectric constant of the dielectric material. The method further includes a step of providing a signal through the coaxial cable and the power rod to the electrostatic chuck while performing a plasma process to form a layer on the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 12 is a chart showing a ratio of a first inner diameter to a second outer diameter, according to characteristic impedance and in dielectric constant.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
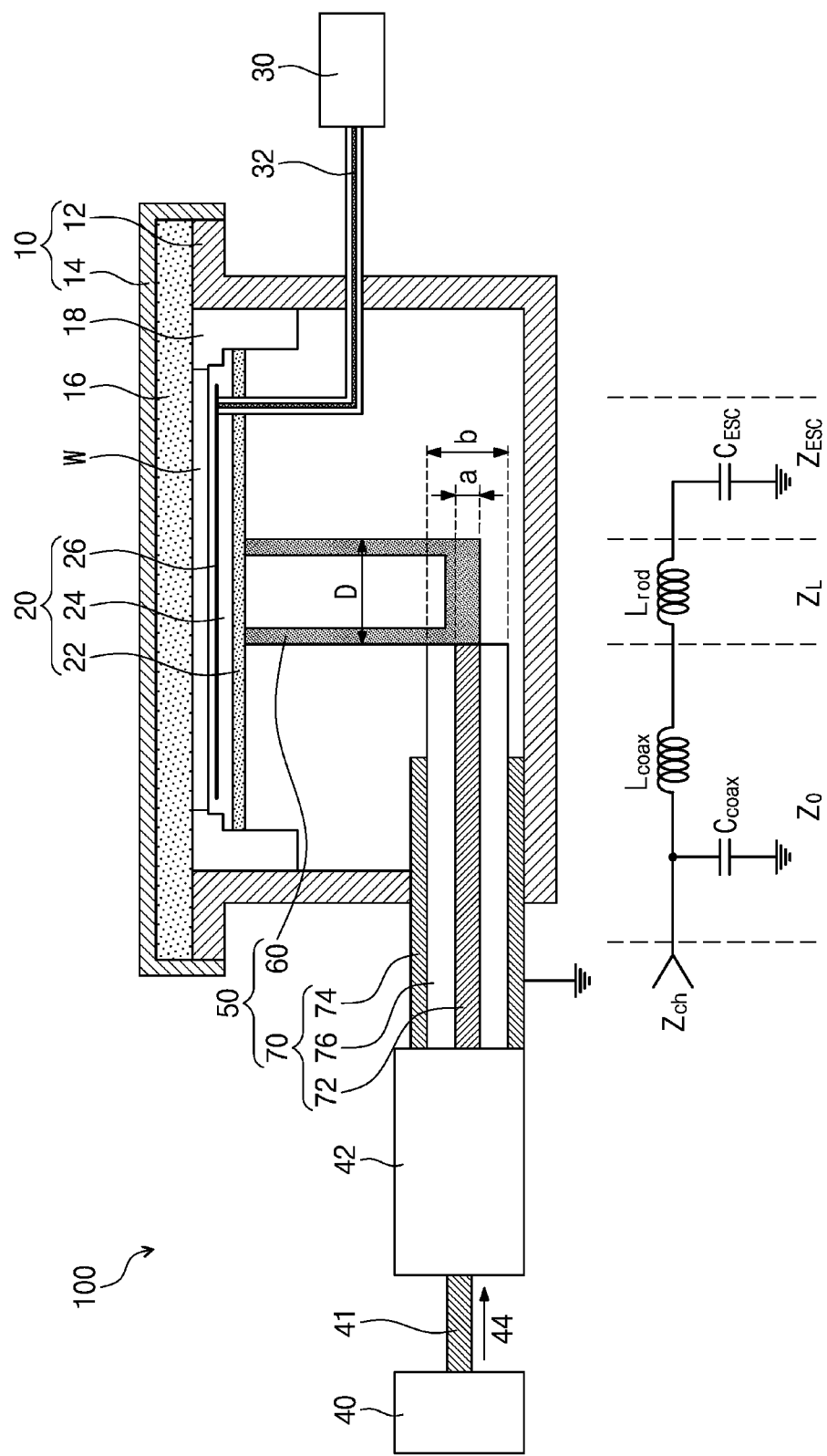
FIG. 1 is a diagram illustrating a system, which is used to fabricate a semiconductor device, and an equivalent circuit thereof according to an exemplary embodiment.

FIG. 1 illustrates a system 100 for fabricating a semiconductor device, according to some example embodiments of the inventive concept, and an equivalent circuit thereof.

Referring to FIG. 1, a system 100 according to some example embodiments of the inventive concept may be used to fabricate a semiconductor device and may include a Capacitively-Coupled Plasma (CCP) etching system. In some example embodiments, the system 100 may include a chamber 10, an electrostatic chuck 20, a voltage source, such as constant voltage source 30, a high frequency or radio frequency (RF) power source 40, an impedance matcher 42, and a power transmission unit 50.

The chamber 10 may be configured to provide a space for isolating a substrate W. The chamber 10 may be formed of or include an aluminum alloy or an iron alloy. In some example embodiments, the chamber 10 may include a lower housing 12 and an upper housing 14. The upper housing 14 may be provided on the lower housing 12

The electrostatic chuck 20 may be provided in the lower housing 12. If the upper housing 14 and the lower housing 12 are separated from each other, the substrate W may be loaded on the electrostatic chuck 20. A ring member 18 may be provided between an inner wall of the lower housing 12 and the electrostatic chuck 20. The ring member 18 may electrically disconnect the electrostatic chuck 20 from the inner wall of the lower housing 12. In some example embodiments, the electrostatic chuck 20 may include a base 22, an insulating layer 24, and a chucking electrode 26. The base 22 may include a metal plate. The insulating layer 24 may be provided on the base 22. The insulating layer 24 may be formed of or include, for example, at least one of metal oxide ceramics. The chucking electrode 26 may be provided in the insulating layer 24.

The constant voltage source 30 may be configured to provide the constant voltage to the chucking electrode 26 of the electrostatic chuck 20. The constant voltage may be, for example, a DC voltage of several hundreds of volts V. The constant voltage applied to the chucking electrode 26 may be used to realize the Johnsen-Rahbek effect, allowing the substrate W to be fixedly fastened to a top surface of the insulating layer 24. A first cable 32 may be provided to penetrate the base 22 and the lower housing 12 and may be used to connect the chucking electrode 26 to the constant voltage source 30.

The RF power source 40 may be configured to supply an RF power 44 to the base 22. The base 22 may be used as a source electrode and/or a bias electrode for generating plasma 16 in the chamber 10. For example, if the RF power 44 is supplied to the base 22, the RF power 44 may be used to generate the plasma 16 over the substrate W. Capacitance between the substrate W and the base 22 may be dependent on capacitance $C_{ESC}$ of the electrostatic chuck 20. The capacitance $C_{ESC}$ of the electrostatic chuck 20 may be directly proportional to an area of the base 22, a dielectric constant of the insulating layer 24 and may be inversely proportional to a thickness of the insulating layer 24. Thus, if the area of the base 22 is increased, the capacitance $C_{ESC}$ of the electrostatic chuck 20 is also increased, thereby increasing the capacitance between the substrate W and the base 22. If the area of the base 22 is decreased, the capacitance $C_{ESC}$ of the electrostatic chuck 20 is also decreased, thereby decreasing the capacitance between the substrate W and the base 22. Also, if the thickness of the insulating layer 24 is decreased, the capacitance $C_{ESC}$ of the electrostatic chuck 20 is increased, hereby increasing the capacitance between the substrate W and the base 22. If the thickness of the insulating layer 24 is increased, the capacitance $C_{ESC}$ of the electrostatic chuck 20 is decreased, thereby decreasing the capacitance between the substrate W and the base 22. The capacitance $C_{ESC}$ of the electrostatic chuck 20 may be calculated using chuck impedance $Z_{ESC}$ of the electrostatic chuck 20.

The RF power 44 may have a power of about 1 KW to about 100 KW and a frequency of about 60 MHz. The RF power 44 may have a sinusoidal waveform.

The impedance matcher 42 may be provided between the RF power source 40 and the base 22 and may be used to electrically connect the RF power source 40 to the base 22. For example, a second cable 41 may be provided to connect the impedance matcher 42 to the RF power source 40. The RF power source 40 may supply the RF power 44 to the impedance matcher 42 through the second cable 41. The impedance matcher 42 may be configured to supply the RF power 44 to the power transmission unit 50 and the electrostatic chuck 20. The impedance matcher 42 may be configured to allow the source impedance of the RF power source 40 to have impedance matched with a chamber impedance $Z_{ch}$ of the chamber 10. Furthermore, the impedance matcher 42 may be configured to remove reflection power, which is reflected from the chamber 10 toward the RF power source 40, thereby protecting the RF power source 40. The impedance matcher 42 may also be configured to allow the RF power 44 to have the maximized energy efficiency. For example, in the case where the RF power source 40 has source impedance of about 50Ω, the chamber impedance $Z_{ch}$ may be adjusted to about 50Ω by the impedance matcher 42. The chamber impedance $Z_{ch}$ may be expressed as a complex number with a real part (R) and an imaginary part (X): i.e., $Z_{ch}=R+iX$.

The power transmission unit 50 may be configured to connect the base 22 to the impedance matcher 42. In some example embodiments, the power transmission unit 50 may include a power rod 60 and a coaxial cable 70.

The power rod 60 may be connected to a lower portion of the electrostatic chuck 20. For example, the power rod 60 may be connected to a bottom surface of the base 22. The power rod 60 may include a copper tube or an aluminum tube. An outer surface of the power rod 60 may be used as a path for transmitting the RF power 44. For example, the outer surface of the power rod 60 may be used as a path for transmitting the RF power 44 to the base 22. The power rod 60 may have a first outer diameter D in a direction parallel to the bottom surface of the base 22 (i.e., a bottom surface of the electrostatic chuck 20). The first outer diameter D of the power rod may have a value ranging from about 62 mm to about 120 mm. Since an area of a bottom surface of the base 22 is fixed, the first outer diameter D of the power rod 60 may be less than about 120 mm. The power rod 60 may have a rod reactance $L_{rod}$, when the RF power 44 is supplied. The rod reactance $L_{rod}$ may be given by a function of the first outer diameter D (i.e., $L_{rod}=f(D)$). The rod reactance $L_{rod}$ may be obtained from the rod impedance $Z_L$. The impedance $Z_{ch}$ of the chamber 10 may be proportional to the rod impedance $Z_L$.

The coaxial cable 70 may be provided to connect the power rod 60 to the impedance matcher 42. The coaxial cable 70 may include an inner wire 72, an outer wire 74, and a dielectric material 76. The inner wire 72 may be provided to connect the power rod 60 to the impedance matcher 42. The inner wire 72 may have a second outer diameter 'a' The second outer diameter 'a' may have a value of about 15 mm or larger. The second outer diameter may be a diameter at an outer surface of the inner wire 72. For example, when the second outer diameter 'a' of the inner wire 72 is less than about 15 mm, the inner wire 72 may be easily heated by the RF power 44. The outer wire 74 may be provided between the lower housing 12 and the inner wire 72 and may enclose the inner wire 72. The outer wire 74 may be grounded. The outer wire 74 may have a tubular shape. The dielectric material 76 may be provided between the outer wire 74 and the inner wire 72. According to exemplary embodiments, as illustrated in FIG. 1, the outer wire 74 may have a first inner diameter 'b'. The first inner diameter may be a diameter of an inner surface of the outer wire 74. The first inner diameter 'b' of the outer wire 74 may have a value larger than the second outer diameter 'a' of the inner wire 72 and smaller than the first outer diameter D of the power rod 60.

If the RF power 44 is provided to the inner wire 72, the inner wire 72 may have coaxial reactance $L_{coax}$ and coaxial capacitance $C_{coax}$. For example, when 'a' represents a value of the second outer diameter of the inner wire 72, 'b' represents a value of the first inner diameter of the outer wire 74, and 'ε' represents a value of the dielectric constant of the dielectric material 76, it may be possible to calculate the coaxial reactance $L_{coax}$ and the coaxial capacitance $C_{coax}$. For example, the coaxial reactance $L_{coax}$ may be given by $\mu(\ln(b/a))/2\pi$, where a and b are the second outer diameter and the first inner diameter, respectively, is a relative permeability of about 1, and π is about 3.14. The coaxial capacitance $C_{coax}$ may be given by $2\pi\varepsilon/(\ln(b/a))$, where ε is a dielectric constant of the dielectric material 76. If the coaxial reactance $L_{coax}$ and the coaxial capacitance $C_{coax}$ is obtained, characteristic impedance $Z_0$ of the coaxial cable 70 may be given by an equation of $Z_0=\sqrt{L_{coax}/C_{coax}}$. Although not shown, each of the coaxial reactance $L_{coax}$ and the coaxial capacitance $C_{coax}$ may be calculated for five separated portions and may be used to obtain the characteristic impedance $Z_0$. The impedance $Z_{ch}$ of the chamber 10 may be proportional to the characteristic impedance $Z_0$. The chamber impedance $Z_{ch}$ may be determined by combination of the characteristic impedance $Z_0$, the rod impedance $Z_L$, and the plasma impedance $Z_p$ (e.g., plasma load).

In some example embodiments, the RF power 44 may produce a plurality of harmonics in the chamber 10. A driving frequency of the RF power 44 may be modulated according to electric characteristics of the coaxial cable 70 to produce the plurality of harmonics. The harmonics may include second to n-th harmonics. A frequency of each of the second to n-th harmonics may be an integral multiple of the driving frequency of the RF power 44.

When the RF power 44 has the driving frequency of 60 MHz, the second to fourth harmonics may have frequencies of 120 MHz, 180 MHz, and 240 MHz, respectively. The chamber impedance $Z_{ch}$ may be calculated for each of the RF power 44 having the driving frequency and the second to fourth harmonics.

Figure 2:
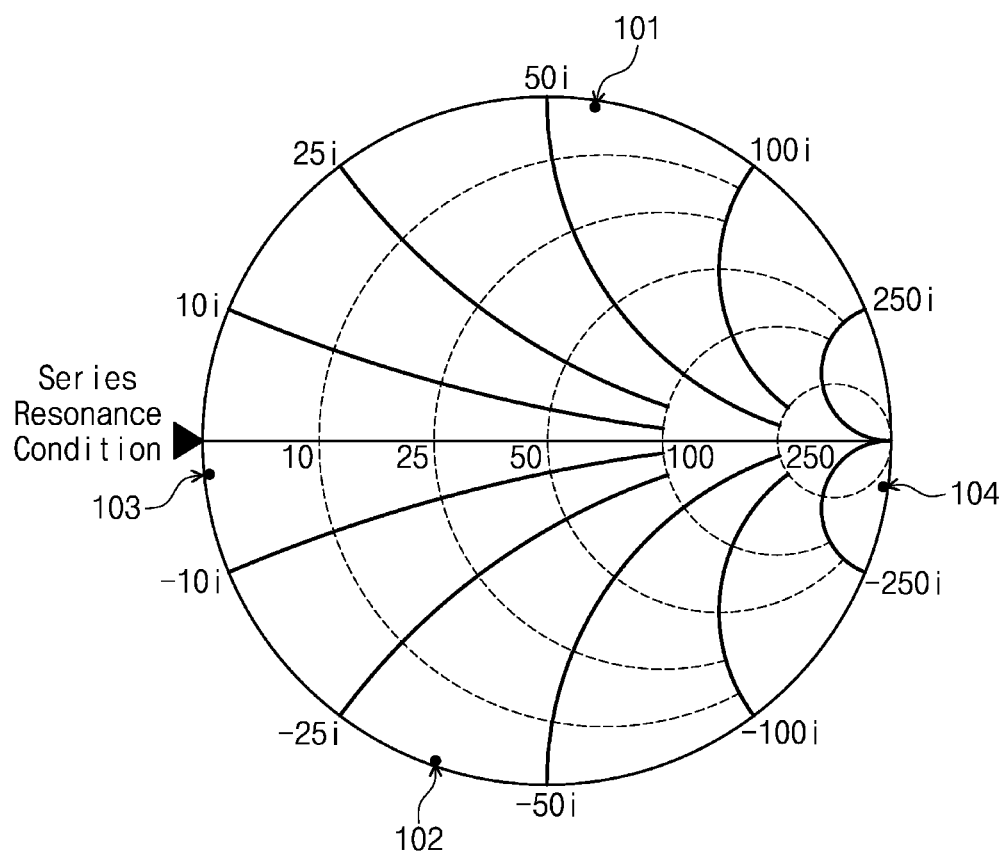
FIG. 2 is a Smith chart showing imaginary values of a chamber impedance for a radio frequency (RF) power of FIG. 1 and second to fourth harmonics.

FIG. 2 is a Smith chart showing imaginary values 101, 102, 103, and 104 of the chamber impedance $Z_{ch}$ for the RF power 44 of FIG. 1 and the second to fourth harmonics.

Referring to FIG. 2, the imaginary value 101 of the chamber impedance $Z_{ch}$ for the RF power 44 of the driving frequency may be about +50Ω, the imaginary value 102 of the chamber impedance $Z_{ch}$ for the second harmonic may be about −37.5Ω, the imaginary value 103 of the chamber impedance $Z_{ch}$ for the third harmonic may be about −3Ω, and the imaginary value 104 of the chamber impedance $Z_{ch}$ for the fourth harmonic may be about −400Ω. The real values of the second to fourth harmonics the chamber impedance $Z_{ch}$ may be almost zero.

In the case where an absolute value of the imaginary value 103 of the chamber impedance $Z_{ch}$ for the third harmonic is less than 10, the chamber impedance $Z_{ch}$ may approach the series resonance condition, as shown in the Smith chart of FIG. 2, and under such a condition, the etch uniformity of the substrate W may be decreased.

Hereinafter, a relationship between the absolute value of the imaginary value 103 of the chamber impedance $Z_{ch}$ for the third harmonic and the etch uniformity of the substrate W will be described in more detail.

Terms such as "same," or "equal," as used herein when referring to sizes, amounts, or other measures do not necessarily mean an exactly identical size, amount, or other measure, but are intended to encompass nearly identical sizes, amounts, or other measures within acceptable variations that may occur, for example, due to manufacturing processes.

Terms such as "about" or "approximately" may reflect amounts, or sizes, that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Figure 3:
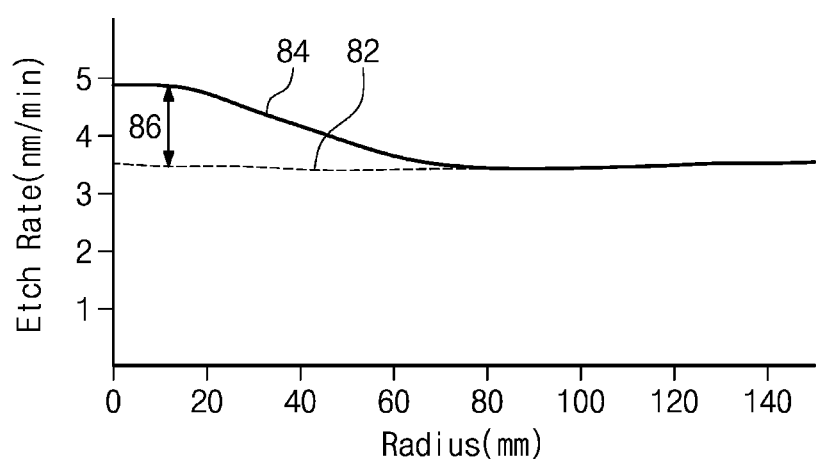
FIG. 3 is a graph showing an abnormal etch profile, in which an absolute value of an imaginary value of the chamber impedance for the third harmonic of FIG. 2 is less than 10, and a normal etch profile, in which the absolute value is greater than 10.

FIG. 3 is a graph showing an abnormal etch profile 84, in which the absolute value of the imaginary value of the chamber impedance $Z_{ch}$ for the third harmonic of FIG. 2 is less than 10, and a normal etch profile 82, in which the absolute value is greater than 10.

As shown in FIG. 3, an etch rate in the normal etch profile 82 may be uniform throughout the substrate W, whereas an etch rate in the abnormal etch profile 84 may be abnormally higher at a center region of the substrate W.

The abnormal etch profile 84 may occur when the absolute value of the imaginary value 103 of the chamber impedance $Z_{ch}$ for the third harmonic is less than 10. For example, when the absolute value of the imaginary value 103 of the chamber impedance $Z_{ch}$ for the third harmonic is less than 10, the chamber impedance $Z_{ch}$ may be decreased. If the chamber impedance $Z_{ch}$ is decreased, the RF power 44 in the chamber 10 may be lowered to enhance a standing wave effect at a center region of the substrate W. Owing to the standing wave effect, an etch rate at the center region of the substrate W in the abnormal etch profile 84 may be different from that in the normal etch profile 82 by a difference in etch rate 86. Thus, when the absolute value of the imaginary value of the chamber impedance $Z_{ch}$ for the third harmonic is less than 10, the etch uniformity of the substrate W may be reduced.

The normal etch profile 82 may occur when the absolute value of the imaginary value 103 of the chamber impedance $Z_{ch}$ for the third harmonic is greater than 10. Thus, the value "10" may be an empirical value, which is used as a lower limit of the absolute value of the imaginary value 103 of the chamber impedance $Z_{ch}$ for the third harmonic. In the case where the absolute value of the imaginary value of the chamber impedance $Z_{ch}$ for the third harmonic is greater than 10, the chamber impedance $Z_{ch}$ may be increased to prevent or suppress the RF power 44 in the chamber 10 from being increased. Thus, it may be possible to etch the substrate W in the normal etch profile 82, without the standing wave effect (i.e., with no difference in etch rate between center and edge regions of the substrate W). Thus, when the absolute value of the imaginary value of the chamber impedance $Z_{ch}$ for the third harmonic is greater than 10, the etch uniformity of the substrate W may be increased.

Figure 4:
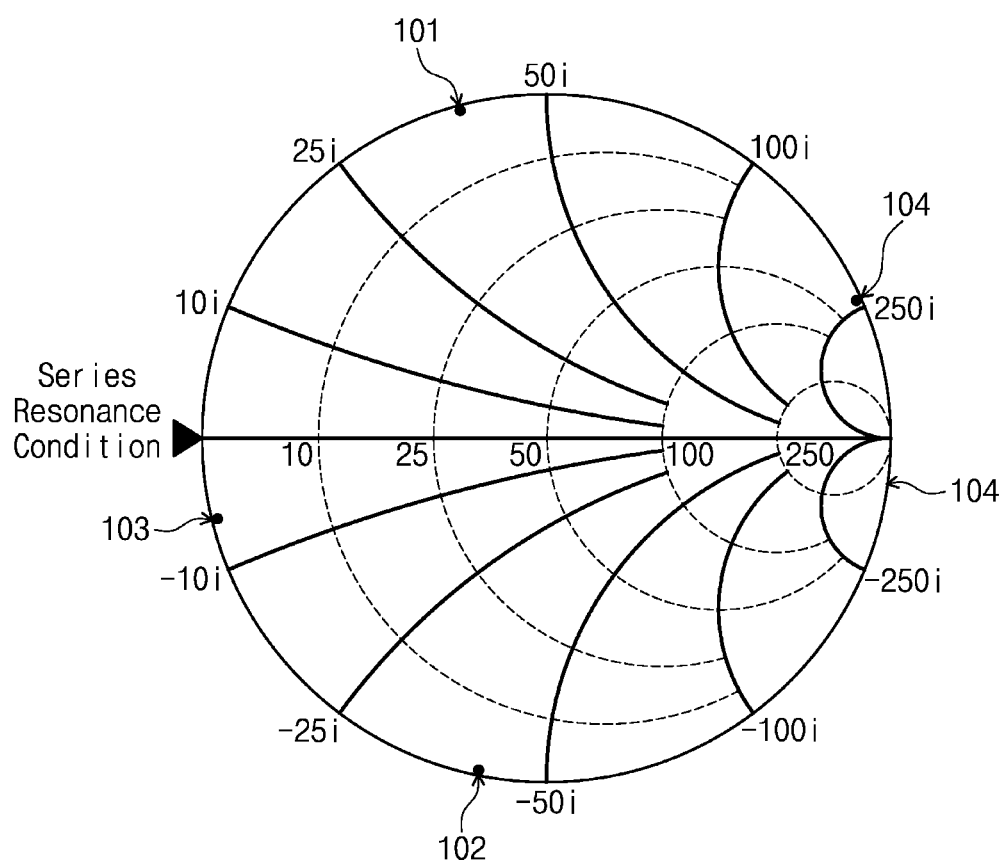
FIG. 4 is a Smith chart showing imaginary values of the chamber impedance for the RF power and the second to fourth harmonics, when a first outer diameter of a power rod is changed without a change in the characteristic impedance of FIG. 1.

FIG. 4 is a Smith chart showing the imaginary values 101-104 of the chamber impedance $Z_{ch}$ for the RF power 44 and the second to fourth harmonics, when the first outer diameter D of the power rod 60 is changed without changing the characteristic impedance $Z_0$ of FIG. 1.

Referring to FIG. 4, when, without any change in the characteristic impedance $Z_0$ of the coaxial cable 70, the first outer diameter D of the power rod 60 is increased from 62.7 mm to 100 mm, the absolute value of the imaginary value 103 of the chamber impedance $Z_{ch}$ for the third harmonic may be about 7. Since the absolute value of the imaginary value 103 of the chamber impedance $Z_{ch}$ for the third harmonic is less than 10, the substrate W may be etched to have the abnormal etch profile 84. The etch uniformity of the substrate W may be reduced. The imaginary value 101 of the chamber impedance $Z_{ch}$ for the RF power 44 may be about +40Ω, the imaginary value 102 of the chamber impedance $Z_{ch}$ for the second harmonic may be about −40Ω, and the imaginary value 104 of the chamber impedance $Z_{ch}$ for the fourth harmonic may be about +240Ω.

Figure 5:
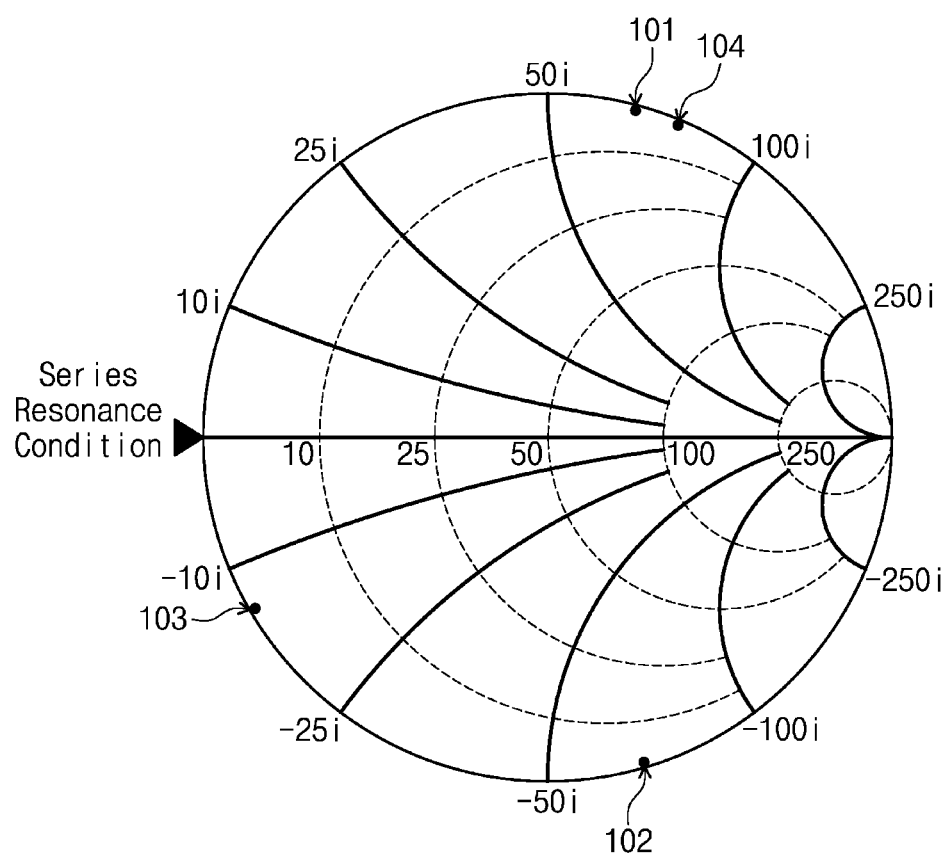
FIG. 5 is a Smith chart showing imaginary values of the chamber impedance for the RF power and the second to fourth harmonics, when the characteristic impedance of the coaxial cable of FIG. 1 is increased from 35.9 Ω to 50Ω.

FIG. 5 is a Smith chart showing the imaginary values 101-104 of the chamber impedance $Z_{ch}$ for the RF power 44 and the second to fourth harmonics, when the characteristic impedance $Z_0$ of the coaxial cable 70 of FIG. 1 is increased from 35.9 Ω to 50Ω.

Referring to FIG. 5, when the characteristic impedance $Z_0$ of the coaxial cable 70 is increased from 35.9 Ω to 50Ω, the absolute value of the imaginary value 103 of the chamber impedance $Z_{ch}$ for the third harmonic may be increased from about 7 to about 14. Since the absolute value of the imaginary value 103 of the chamber impedance $Z_{ch}$ for the third harmonic is greater than 10, the coaxial cable 70 having an increased characteristic impedance $Z_0$ may allow for an increase in etch uniformity of the substrate W, without the difference in etch rate 86.

The imaginary value 101 of the chamber impedance $Z_{ch}$ for the RF power 44 may be about +70Ω, the imaginary value 102 of the chamber impedance $Z_{ch}$ for the second harmonic may be about −70Ω, and the imaginary value 104 of the chamber impedance $Z_{ch}$ for the fourth harmonic may be about +80Ω.

Figure 6:
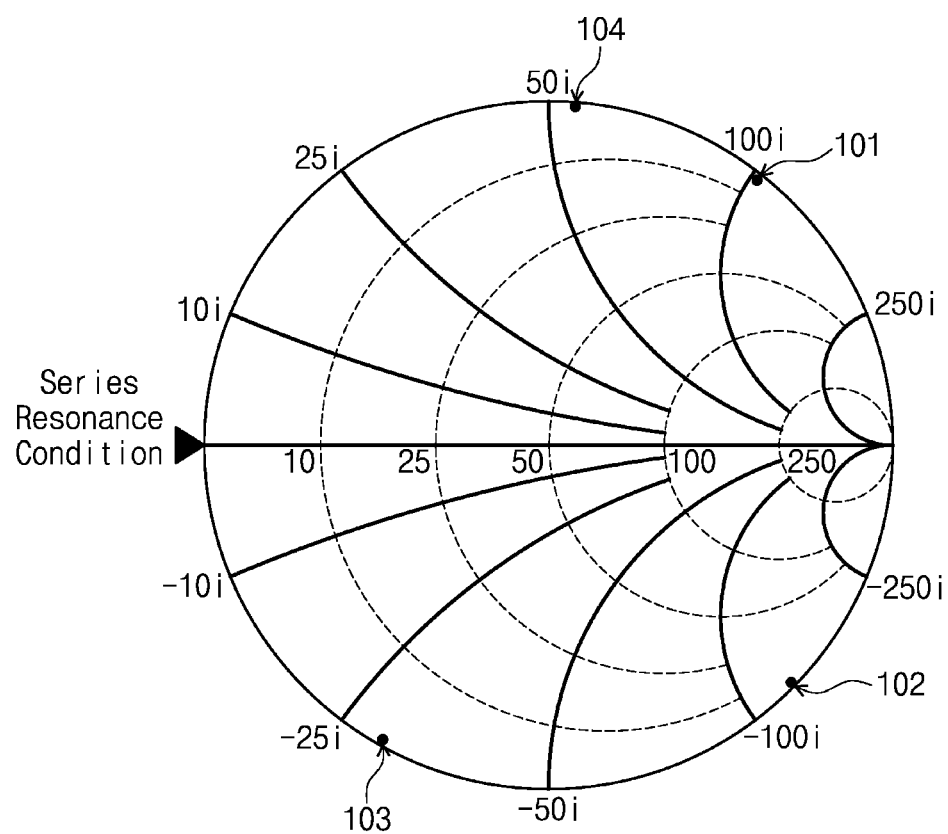
FIG. 6 is a Smith chart showing imaginary values of the chamber impedance for the RF power and the second to fourth harmonics, when the characteristic impedance of the coaxial cable of FIG. 1 is increased from 35.9 Ω to 75Ω.

FIG. 6 is a Smith chart showing the imaginary values 101-104 of the chamber impedance $Z_{ch}$ for the RF power 44 and the second to fourth harmonics, when the characteristic impedance $Z_0$ of the coaxial cable 70 of FIG. 1 is increased from 35.9 Ω to 75Ω.

Referring to FIG. 6, when the characteristic impedance $Z_0$ of the coaxial cable 70 is increased from 35.9 Ω to 75Ω, the absolute value of the imaginary value 103 of the chamber impedance $Z_{ch}$ for the third harmonic may be increased from about 7 to about 29. Since the absolute value of the imaginary value 103 of the chamber impedance $Z_{ch}$ for the third harmonic is greater than 10, the coaxial cable 70 having an increased characteristic impedance $Z_0$ may allow for an increase in etch uniformity of the substrate W.

In the case where the absolute value of the imaginary value 101 of the chamber impedance $Z_{ch}$ is greater than 100, a relatively high voltage may be induced to cause arcing defects in the chamber 10. Here, the value "100" may be an empirical value, which is used as an upper limit of the absolute value of the imaginary value 101 of the chamber impedance $Z_{ch}$ for the RF power 44 of the driving frequency.

The imaginary value 102 of the chamber impedance $Z_{ch}$ for the second harmonic may be about −30Ω, and the imaginary value 104 of the chamber impedance $Z_{ch}$ for the fourth harmonic may be about −120Ω.

Figure 7:
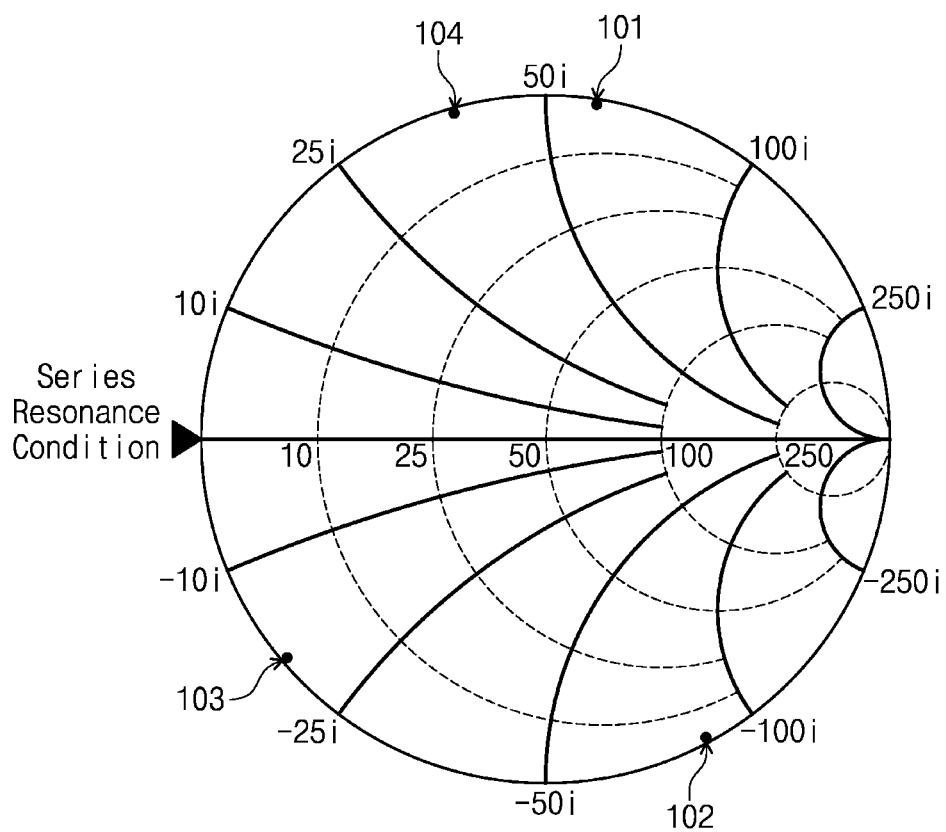
FIG. 7 is a Smith chart showing imaginary values of the chamber impedance for the RF power and the second to fourth harmonics, when the characteristic impedance of the coaxial cable of FIG. 1 is 50Ω and a first outer diameter of a power rod is 100 mm.

FIG. 7 is a Smith chart showing the imaginary values 101-104 of the chamber impedance $Z_{ch}$ for the RF power 44 and second to fourth harmonics, when the characteristic impedance $Z_0$ of FIG. 1 is 50Ω and the first outer diameter D of the power rod 60 is increased from 62.7 mm to 100 mm.

Referring to FIG. 7, when the characteristic impedance $Z_0$ is 50Ω and the first outer diameter D of the power rod 60 is increased from 62.7 mm to 100 mm, the absolute value of the imaginary value 101 of the chamber impedance $Z_{ch}$ for the RF power 44 may be about 50 less than the upper limit of 100. The RF power 44 may be transmitted to the electrostatic chuck 20 through the power rod 60, without arcing defects in the chamber 10. The absolute value of the imaginary value 103 of the chamber impedance $Z_{ch}$ for the third harmonic may be about 20 greater than the lower limit of 10. If the first outer diameter D of the power rod 60 is increased, the absolute value of the imaginary value 101 of the chamber impedance $Z_{ch}$ for the RF power 44 and the absolute value of the imaginary value 103 of the chamber impedance $Z_{ch}$ for the third harmonic may be increased.

The imaginary value 102 of the chamber impedance $Z_{ch}$ for the second harmonic may be about −80Ω, and the imaginary value 104 of the chamber impedance $Z_{ch}$ for the fourth harmonic may be about +40Ω.

Figure 8:
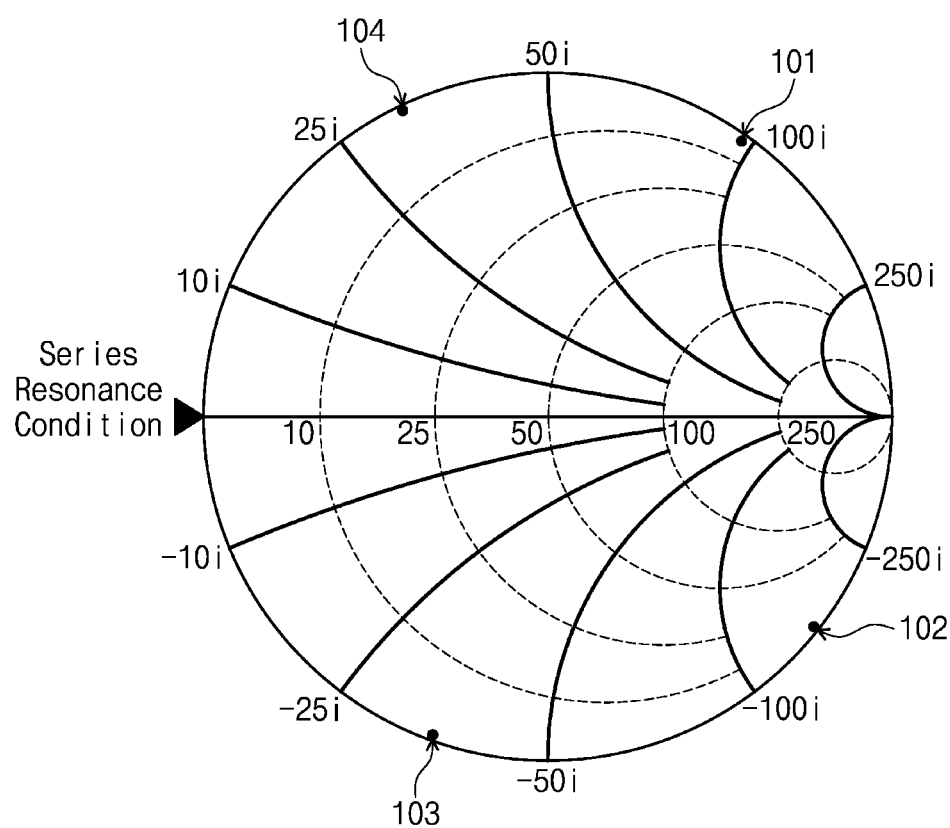
FIG. 8 is a Smith chart showing imaginary values of the chamber impedance for the RF power and the second to fourth harmonics, when the characteristic impedance of the coaxial cable of FIG. 1 is 75Ω and a first outer diameter of a power rod is 100 mm.

FIG. 8 is a Smith chart showing the imaginary values 101-104 of the chamber impedance $Z_{ch}$ for the RF power 44 and second to fourth harmonics, when the characteristic impedance $Z_0$ of the coaxial cable 70 of FIG. 1 is increased from 35.9 Ω to 75Ω and the first outer diameter D of the power rod 60 is increased from 62.7 mm to 100 mm.

Referring to FIG. 8, when the characteristic impedance $Z_0$ is increased from 50Ω to 75Ω and the first outer diameter D of the power rod 60 is increased from 62.7 mm to 100 mm, the absolute value of the imaginary value 101 of the chamber impedance $Z_{ch}$ for the RF power 44 may be about 90 that is less than the upper limit of 100. The RF power 44 may be transmitted to the electrostatic chuck 20 through the power rod 60, without arcing defects in the chamber 10. The absolute value of the imaginary value 103 of the chamber impedance $Z_{ch}$ for the third harmonic may be about 30 that is larger than the lower limit of 10.

If the characteristic impedance $Z_0$ is increased, the absolute value of the imaginary value 101 of the chamber impedance $Z_{ch}$ for the RF power 44 and the absolute value of the imaginary value 103 of the chamber impedance $Z_{ch}$ for the third harmonic may be increased.

The imaginary value 102 of the chamber impedance $Z_{ch}$ for the second harmonic may be about −150Ω, and the imaginary value 104 of the chamber impedance $Z_{ch}$ for the fourth harmonic may be about +30Ω.

Figure 9:
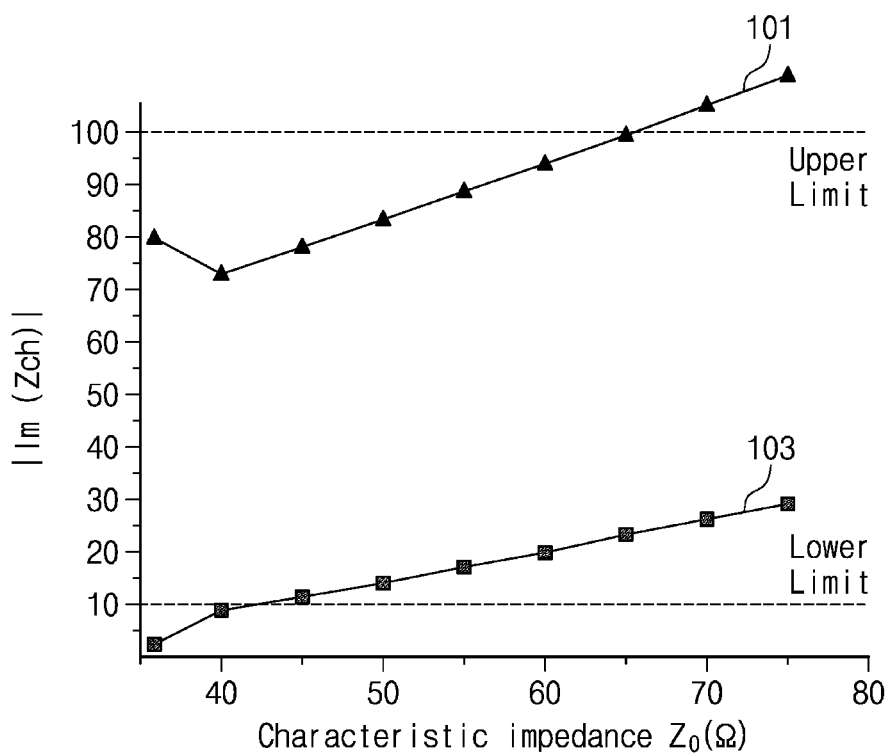
FIG. 9 is a graph showing a change in imaginary values of the chamber impedance for the RF power having a driving frequency and the third harmonic caused by a change in the characteristic impedance, when the first outer diameter of the power rod of FIG. 1 is 62.7 mm.

FIG. 9 is a graph showing a change in the imaginary values 101 and 103 of the chamber impedance $Z_{ch}$ for the RF power 44 and the third harmonic caused by a change in the characteristic impedance $Z_0$, when the first outer diameter D of the power rod 60 of FIG. 1 is 62.7 mm.

Referring to FIG. 9, when the first outer diameter D of the power rod 60 is 62.7 mm, the characteristic impedance $Z_0$ from about 45Ω to about 65Ω may be between the upper and lower limits of the imaginary values 101 and 103 of the chamber impedance $Z_{ch}$ for the RF power 44 of the driving frequency and the third harmonic. When the first outer diameter D of the power rod 60 is 62.7 mm and the characteristic impedance $Z_0$ of the coaxial cable 70 is within the range between about 45Ω and about 65Ω, the power rod 60 and the coaxial cable 70 may allow the substrate W to be etched with an increased etch uniformity, without arcing defects.

Figure 10:
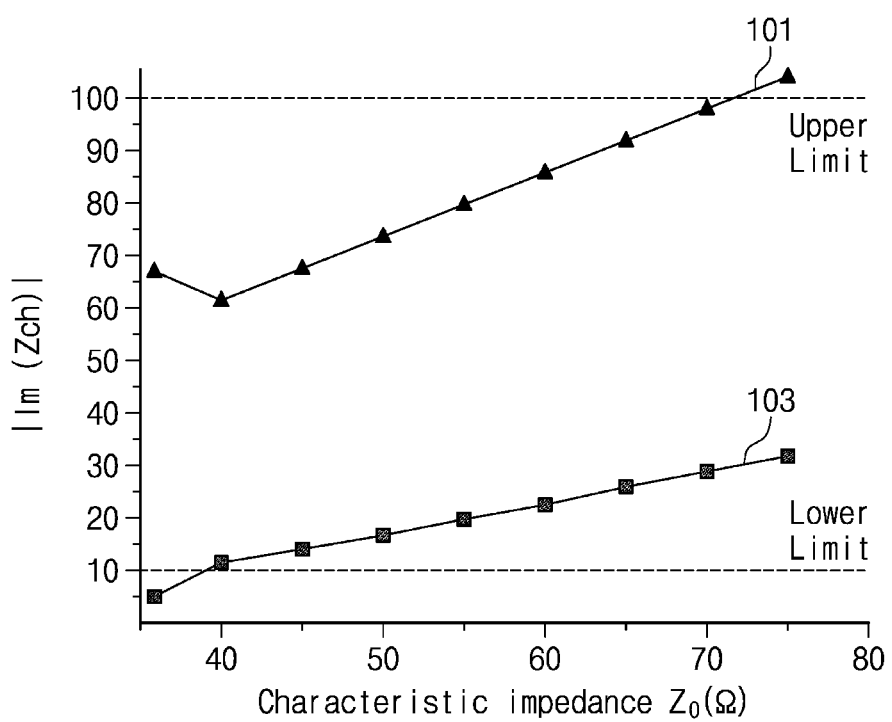
FIG. 10 is a graph showing a change in imaginary values of the chamber impedance for the RF power and the third harmonic caused by a change in the characteristic impedance, when the first outer diameter of the power rod of FIG. 1 is 90 mm.

FIG. 10 is a graph showing a change in the imaginary values 101 and 103 of the chamber impedance $Z_{ch}$ for the RF power 44 and the third harmonic caused by a change in the characteristic impedance $Z_0$, when the first outer diameter D of the power rod 60 of FIG. 1 is 90 mm.

Referring to FIG. 10, when the first outer diameter D of the power rod 60 is 90 mm, the characteristic impedance $Z_0$ from about 40Ω and about 70Ω may be between the upper and lower limits of the imaginary values 101 and 103 of the chamber impedance $Z_{ch}$ for the RF power 44 and the third harmonic. When the first outer diameter D of the power rod 60 is 90 mm and the characteristic impedance $Z_0$ of the coaxial cable 70 is within a range between about 40Ω and about 70Ω, the power rod 60 and the coaxial cable 70 may allow the substrate W to be etched with an increased etch uniformity, without arcing defects.

Figure 11:
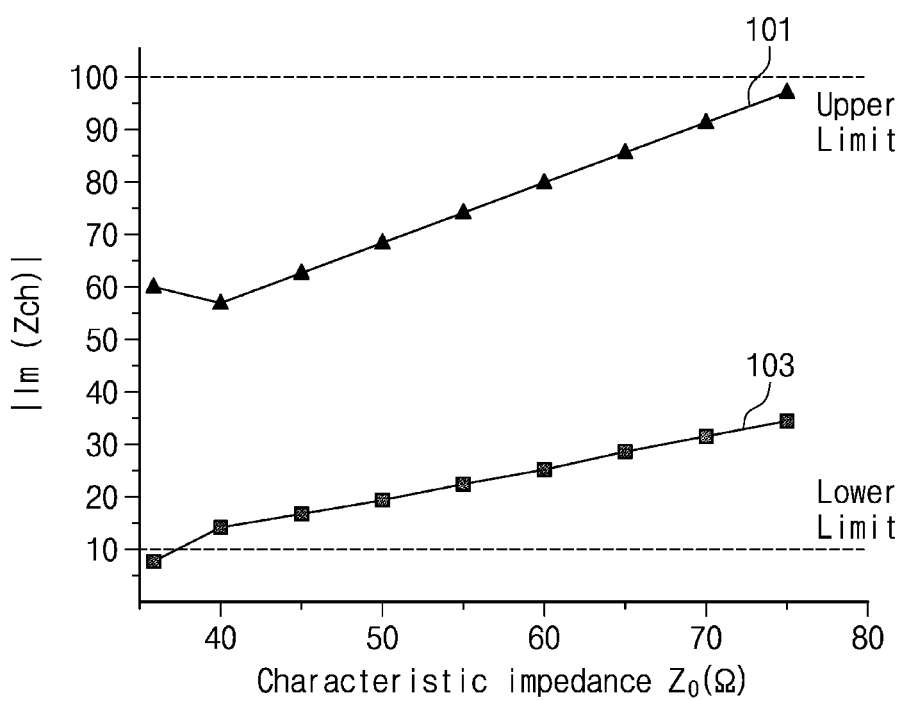
FIG. 11 is a graph showing a change in imaginary values of the chamber impedance for the RF power and the third harmonic caused by a change in the characteristic impedance, when the first outer diameter of the power rod of FIG. 1 is 120 mm.

FIG. 11 is a graph showing a change in the imaginary values 101 and 103 of the chamber impedance $Z_{ch}$ for the RF power 44 and the third harmonic caused by a change in the characteristic impedance $Z_0$, when the first outer diameter D of the power rod 60 of FIG. 1 is 120 mm.

Referring to FIG. 11, when the first outer diameter D of the power rod 60 is 120 mm, the characteristic impedance $Z_0$ from about 40Ω and about 75Ω may be between the upper and lower limits of the imaginary values 101 and 103 of the chamber impedance $Z_{ch}$ for the RF power 44 and the third harmonic. When the first outer diameter D of the power rod 60 is 120 mm and the characteristic impedance $Z_0$ of the coaxial cable 70 is within a range between about 40Ω and about 75Ω, the power rod 60 and the coaxial cable 70 may allow the substrate W to be etched with an increased etch uniformity, without arcing defects.

If the characteristic impedance $Z_0$ of the coaxial cable 70 is set, a ratio of the first inner diameter 'b' to the second outer diameter 'a' (i.e., b/a) may be calculated, based on a dielectric constant (ε) of the dielectric material 76.

FIG. 12 is a chart showing a ratio of b/a according to the characteristic impedance $Z_0$ and the dielectric constant (ε).

Referring to FIG. 12, when the characteristic impedance $Z_0$ of the coaxial cable 70 is within a range between about 45Ω and about 65Ω, the ratio of b/a may be greater than a dielectric constant of the dielectric material 76 and may be less than about three times the dielectric constant of the dielectric material 76. Thus, the coaxial cable 70 may allow for an increase in etch uniformity, and therefore, may be possible to generate the plasma 16 in the chamber 10, without an arcing issue.

The dielectric material 76 may be formed of or include at least one of air (e.g., atmospheric air), Teflon, Ultem, PEEK, quartz, or alumina. The dielectric constant of the air may be about 1, the dielectric constant of the Teflon may be about 2.1, the dielectric constant of the Ultem may be about 3.0, the dielectric constant of the PEEK may be 3.2, the dielectric constant of the Quartz may be 3.9, and the dielectric constant of the alumina may be 9.0. The term "air" as discussed herein, may refer to atmospheric air, or other gases that may be present during the manufacturing process.

When the characteristic impedance $Z_0$ of the coaxial cable 70 is within a range between about 45Ω and about 65Ω, and the dielectric material 76 is formed of the air (ε=1), the ratio of b/a may range from 2.12 to 2.95. When the characteristic impedance $Z_0$ of the coaxial cable 70 is within a range between about 45Ω and about 65Ω, and the dielectric material 76 is formed of Teflon (ε=2.1), the ratio of b/a may range from 2.96 to 4.80. When the characteristic impedance $Z_0$ of the coaxial cable 70 is within a range between about 45Ω and about 65Ω, and the dielectric material 76 is formed of Ultem (ε=3.0), the ratio of b/a may range from 3.66 to 6.52. When the characteristic impedance $Z_0$ of the coaxial cable 70 is within a range between about 45Ω and about 65Ω, and the dielectric material 76 is formed of PEEK (ε=3.2), the ratio of b/a may range from 3.82 to 6.93. When the characteristic impedance $Z_0$ of the coaxial cable 70 is within a range between about 45Ω and about 65Ω, and the dielectric material 76 is formed of quartz (ε=3.9), the ratio of b/a may range from 4.39 to 8.48. In the case where the dielectric material 76 is formed of alumina (ε=9.0), the ratio of b/a may range from 9.47 to 25.72.

When the characteristic impedance $Z_0$ of the coaxial cable 70 ranges from about 50Ω to about 60Ω, the ratio of b/a may be about two times the dielectric constant of the dielectric material 76. Thus, the coaxial cable 70 may allow for an increase in etch uniformity and therefore, the plasma 16 may be generated without an arcing issue.

When the characteristic impedance $Z_0$ of the coaxial cable 70 ranges from about 50Ω to about 60Ω and the dielectric material 76 is formed of the air (ε=1), the ratio of b/a may range from 2.30 to 2.72. When the characteristic impedance $Z_0$ of the coaxial cable 70 ranges from about 50Ω to about 60Ω and the dielectric material 76 is formed of Teflon (ε=2.1), the ratio of b/a may range from 3.34 to 4.25. When the characteristic impedance $Z_0$ of the coaxial cable 70 ranges from about 50Ω to about 60Ω and the dielectric material 76 is formed of Ultem (ε=3.0), the ratio of b/a may range from 4.23 to 5.64. When the characteristic impedance $Z_0$ of the coaxial cable 70 ranges from about 50Ω to about 60Ω and the dielectric material 76 is formed of PEEK (ε=3.2), the ratio of b/a may range from 4.43 to 5.97. When the characteristic impedance $Z_0$ of the coaxial cable 70 ranges from about 50Ω to about 60Ω and the dielectric material 76 is formed of quartz (ε=3.9), the ratio of b/a may range from 5.18 to 7.19. When the characteristic impedance $Z_O$ of the coaxial cable 70 ranges from about 50Ω to about 60Ω and the dielectric material 76 is formed of alumina (ε=9.0), the ratio of b/a may range from 12.16 to 20.03.

Figure 13:
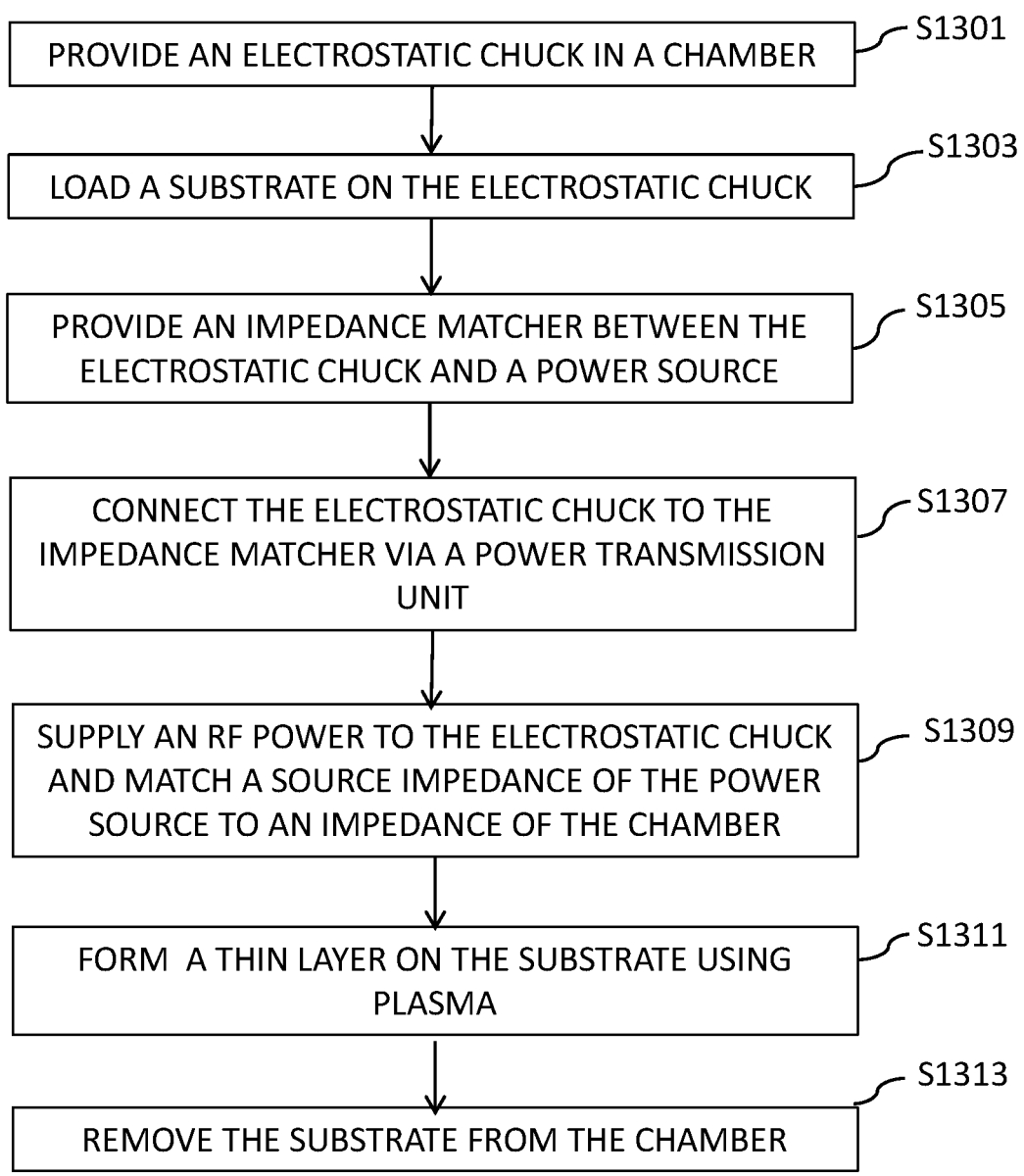
FIG. 13 is flow chart showing a method of fabricating a semiconductor device according to exemplary embodiments of the present disclosure.

FIG. 13 is flow chart showing a method of fabricating a semiconductor device according to exemplary embodiments of the present disclosure.

In step S1301, an electrostatic chuck is provided in a chamber. The electrostatic chuck may be an electrostatic chuck 20 and the chamber may be a chamber 10 according to the exemplary embodiments as disclosed above.

In step S1303, a substrate is loaded on the electrostatic chuck 20. The substrate may be a substrate W according to the exemplary embodiments as disclosed above.

In step S1305, an impedance matcher is provided between the electrostatic chuck 20 and a power source. The impedance matcher may be an impedance matcher 42 and the power source may be a power source 40 according to the exemplary embodiments as disclosed above. The power source 40 is configured to supply an RF power to the electrostatic chuck 20 and the impedance matcher 42 is configured to allow a source impedance of the power source 40 to have an impedance value match with an impedance value of the chamber 10.

In step S1307, the electrostatic chuck 20 is connected to the impedance matcher 42 via a power transmission unit. The power transmission unit may be a power transmission unit 50 according to the exemplary embodiments as disclosed above. The power transmission unit 50 may include a power rod 60 and a coaxial cable 70 including an inner wire 72, an outer wire 74, and a dielectric material 76 between the outer wire 74 and the inner wire 72. The power rod 60 may be connected to the electrostatic chuck 20 and the power rod 60 may have a first outer diameter D in a direction parallel to a bottom surface of the electrostatic chuck 20. The inner wire 72 may connect the power rod 60 to the impedance matcher 42. The inner wire 72 may have a second outer diameter 'a' in a direction perpendicular to the bottom surface of the electrostatic chuck 20 less than the first outer diameter D of the power rod 60. The outer wire 74 may be connected to the chamber 10 and may be provided to enclose the inner wire 72. The outer wire 74 may have a first inner diameter 'b' in the direction perpendicular to the bottom surface of the electrostatic chuck 20 less than the first outer diameter D of the power rod and greater than the second outer diameter 'a' of the inner wire 72. A ratio of the first inner diameter to the second outer diameter (b/a) is greater than a dielectric constant (ε) of the dielectric material 76 and less than three times the dielectric constant (ε).

In step S1309, an RF power is supplied by the power source 40 to the electrostatic chuck 20 and a source impedance of the power source 40 is matched with an impedance of the chamber 10 by the impedance matcher 42.

In step S1311, a thin layer is formed on the substrate W using plasma. A signal may be provided through the coaxial cable 70 and the power rod 60 to the electrostatic chuck 20 while performing a plasma process to form the thin layer on the substrate W.

In step S1313, the substrate W is removed from the chamber 10. Semiconductor chips (having integrated circuits formed therein) may be cut from the wafer W and form elements of a semiconductor device.

According to some example embodiments of the inventive concept, a system for fabricating a semiconductor device may be configured to increase a characteristic imped-ance of a power transmission unit and thereby to increase an etch uniformity in a process of etching a substrate.

While example embodiments of the inventive concepts have been particularly shown and described, it will be understood by one of ordinary skill in the art that variations in form and detail may be made therein without departing from the spirit and scope of the attached claims.

What is claimed is:

1. A system for fabricating a semiconductor device, comprising:
   a chamber;
   an electrostatic chuck provided in the chamber and used to load a substrate;
   a power source configured to supply an RF power having a first frequency to the electrostatic chuck;
   an impedance matcher provided between the power source and the electrostatic chuck to connect the power source to the electrostatic chuck; and
   a power transmission unit connecting the electrostatic chuck to the impedance matcher, wherein the power transmission unit comprises:
   a power rod connected to the electrostatic chuck, the power rod having a first outer diameter; and
   a coaxial cable including an inner wire, an outer wire, and a dielectric material between the outer and inner wires,
   wherein the inner wire connects the power rod to the impedance matcher and has a second outer diameter less than the first outer diameter,
   wherein the outer wire is directly connected to the chamber and is provided to enclose the inner wire and has a first inner diameter less than the first outer diameter and greater than the second outer diameter, and
   wherein a ratio of the first inner diameter to the second outer diameter is greater than a dielectric constant of the dielectric material and less than three times the dielectric constant of the dielectric material, and
   wherein the first outer diameter of the power rod is 120 mm;
   wherein the impedance matcher is configured to match chamber impedance of the RF power in the chamber,
   wherein the chamber generates second to fourth harmonics having second to fourth frequencies corresponding to integral multiples of the first frequency using the RF power,
   wherein the chamber impedance of the chamber includes real values and imaginary values of the second to fourth harmonics,
   wherein an absolute value of the imaginary value of the chamber impedance for the third harmonic is greater than 10, and
   wherein the chamber impedance of the chamber further includes real value and imaginary values of the RF power,
   wherein an absolute value of the imaginary value of the chamber impedance for the RF power is less than 100, and
   wherein the first frequency is 60 MHz.

2. The system of claim 1,
   wherein the impedance matcher is configured to match chamber impedance of the RF power in the chamber, and
   the chamber impedance is proportional to a characteristic impedance of the coaxial cable.

3. The system of claim 1,
   wherein the characteristic impedance of the coaxial cable ranges from about 40Ω to about 75 Ω.

4. The system of claim 1,
wherein the dielectric material comprises at least one of air, Teflon, Ultem, PEEK, Quartz, or alumina.

5. The system of claim 1,
wherein the second outer diameter of the inner wire is greater than 15 mm.

6. The system of claim 1,
wherein the outer wire is grounded.

* * * * *